United States Patent
Brunn et al.

(10) Patent No.: US 7,436,216 B1
(45) Date of Patent: Oct. 14, 2008

(54) METHOD AND APPARATUS FOR A DIRECT CURRENT (DC) COUPLED INPUT BUFFER

(75) Inventors: Brian T. Brunn, Austin, TX (US);
Michael A. Nix, Austin, TX (US);
Ahmed Younis, Austin, TX (US)

(73) Assignee: Xilinx, Inc., San Jose, CA (US)

( * ) Notice: Subject to any disclaimer, the term of this patent is extended or adjusted under 35 U.S.C. 154(b) by 145 days.

(21) Appl. No.: 11/452,858

(22) Filed: Jun. 14, 2006

(51) Int. Cl.
*H03F 3/45* (2006.01)

(52) U.S. Cl. ............... 326/83; 330/260; 330/69; 327/108

(58) Field of Classification Search ............... 330/260, 330/252, 69; 326/30, 83; 327/108
See application file for complete search history.

(56) References Cited

U.S. PATENT DOCUMENTS 4,320,351 A * 3/1982 Brown et al. ............ 330/260
5,300,896 A * 4/1994 Suesserman ............ 330/260

OTHER PUBLICATIONS

U.S. Appl. No. 10/659,971, filed Sep. 11, 2003, Boecker et al.

\* cited by examiner

*Primary Examiner*—Daniel D Chang
(74) *Attorney, Agent, or Firm*—Michael T. Wallace

(57) ABSTRACT

A method and apparatus for combining an alternating current (AC) coupling technique with a low frequency restoration technique to provide AC coupling with low frequency restoration of the attenuated low frequency content. The low frequency restoration circuit operates to extract low frequency information prior to being high-pass filtered by the AC coupling circuit. The low frequency restoration circuit then buffers the low frequency information through a low frequency restoration amplifier, applies a programmable common mode voltage to the buffered, low frequency information, and then restores the buffered, common mode adjusted, low frequency information to the output of the AC coupling circuit.

17 Claims, 4 Drawing Sheets

METHOD AND APPARATUS FOR A DIRECT CURRENT (DC) COUPLED INPUT BUFFER

FIELD OF THE INVENTION

The present invention generally relates to direct current (DC) coupled buffers, and more particularly to DC coupled buffers allowing large common mode voltage variation.

BACKGROUND

Communication developments in the last decade have demonstrated what seems to be a migration from parallel data input/output (I/O) interface implementations to a preference for serial data I/O interfaces. Some of the motivations for preferring serial I/O over parallel I/O include reduced system costs through reduction in pin count, simplified system designs, and scalability to meet the ever increasing bandwidth requirements of today's communication needs. Serial I/O solutions will most probably be deployed in nearly every electronic product imaginable, including IC-to-IC interfacing, backplane connectivity, and box-to-box communications.

Although the need for increased communication bandwidth continues to drive future designs, adaptability also remains as a high priority goal. As such, the future designs are required to provide a wide range of scalability, whereby many of the physical (PHY) layer attributes are adaptable to the various requirements of emerging serial communication protocols.

For example, an input buffer utilized in the implementation of a particular serial communication interface may be required to adapt to either of a direct current (DC) coupled or alternating current (AC) coupled mode of operation. If an AC coupled mode of operation is selected, for example, then substantially all of the low frequency variations of the input signal are filtered, i.e., attenuated, prior to being transferred to the input buffer. Conversely, if a DC coupled mode of operation is selected, then substantially all of the low frequency variations of the input signal are left undisturbed, whereby the full bandwidth of the input signal is applied to the input buffer.

Given that a DC coupled mode of operation is selected, however, an additional design consideration is typically placed on the transmitting end of the transmitter/receiver pair. In particular, the transmitter is often required to maintain the common mode component of the transmitted signal: 1) within a narrow range of variation; and 2) within close proximity to a fixed DC potential, such as ground potential. As such, design constraints on the transmitter may be excessively and unnecessarily imposed.

Another design constraint that may be imposed upon the transmitter/receiver pair is the maintenance of compatibility across the various generations of logic families used to implement the transmitter/receiver pair. A particularly popular logic family that is often utilized, especially for those transmitter/receiver pairs that employ differential serial communications, is current mode logic (CML). CML is typically employed in one of two variations: 1) top-rail power supply referenced CML; and 2) bottom-rail power supply referenced CML.

The top-rail power supply, e.g., $V_{DD}$, referenced CML family provides an output logic level, whose output logic high level, $V_{OH}$, is substantially equal to $V_{DD}$ and whose output logic low level, $V_{OL}$, is substantially equal to $V_{DD}$ minus the product of the tail current and the load resistance as described by equation (1):

$$V_{OL} = V_{DD} - I_{TAIL} * R_{LOAD}. \quad (1)$$

The common mode voltage of the $V_{DD}$-referenced CML logic family, $V_{CM-VDD}$, is calculated to be one-half of the output voltage swing as described by equation (2):

$$V_{CM-VDD} = \frac{(V_{OH} - V_{OL})}{2} = \frac{(V_{DD} - (V_{DD} - I_{TAIL} * R_{LOAD}))}{2}. \quad (2)$$

Conversely, the bottom-rail power supply, e.g., $V_{SS}$, referenced CML family provides an output logic level, whose output logic low level, $V_{OL}$, is substantially equal to $V_{SS}$ and whose output logic high level, $V_{OH}$, is substantially equal to $V_{SS}$ plus the product of the head current and the load resistance as described in equation (3):

$$V_{OH} = V_{SS} + I_{HEAD} * R_{LOAD}. \quad (3)$$

The common mode voltage of the $V_{SS}$-referenced CML logic family, $V_{CM-VSS}$, is calculated to be one-half of the output voltage swing as described by equation (4):

$$V_{CM-VSS} = \frac{(V_{OH} - V_{OL})}{2} = \frac{(V_{SS} + I_{HEAD} * R_{LOAD}) - V_{SS}}{2}. \quad (4)$$

Comparing equation (4) with equation (2), it can be seen that $V_{CM-VSS}$ does not depend upon the top-rail power supply, e.g., $V_{DD}$. More particularly, $V_{CM-VSS}$ is referenced to the bottom-rail power supply, $V_{SS}$, which is typically equal to ground potential. In such an instance, therefore, $V_{CM-VSS}$ is substantially independent of $V_{DD}$ variations across the various generations of CML families and is, therefore, preferred. On the other hand, it can be seen that $V_{CM-VDD}$ of equation (2) is directly proportional to $V_{DD}$ and hence, is directly affected by $V_{DD}$ variations across the various generations of CML families.

Thus, as the design constraints across future generations of CML families force the level of $V_{DD}$ to decrease, the value of $V_{CM-VDD}$ also decreases in direct proportion, as described by equation (2). While this inherent characteristic of $V_{DD}$-referenced CML may not be detrimental in an AC coupled mode of operation, variations in $V_{CM-VDD}$ may nevertheless be detrimental in a DC coupled mode of operation. Particularly when the $V_{CM-VDD}$ voltage approaches the value of $V_{SS}$, e.g., ground potential. In this instance, a typical $V_{DD}$-referenced CML receiver, employing for example, N-type field effect transistors (FETs), may be disabled by such a $V_{CM-VDD}$ characteristic.

Accordingly, the exemplary schematic of input buffer 100 of FIG. 1 may be employed, to provide an AC coupled mode of operation that alleviates the problems discussed above in relation to variations of $V_{CM-VDD}$ across multiple generations of CML families. Furthermore, provisions are also made to accommodate the requisite $V_{CM-VDD}$ characteristic, as discussed above in relation to the N-type FET based, $V_{DD}$-referenced CML receiver, during an AC coupled mode of operation. Disclosure relating to the exemplary embodiment of FIG. 1 is presented in detail by U.S. patent application Ser. No. 10/659,971 entitled "RECEIVER TERMINATION NETWORK AND APPLICATION THEREOF," by Boecker et al., having a filing date of Sep. 11, 2003, and assigned to the assignee of the present invention, the content of which is incorporated herein by reference.

In operation, a differential signal is received by input buffer 100 at nodes $IN_P$ and $IN_N$, which is transmitted by a transmitter (not shown) through a transmission channel (not shown). Resistors 102 and 104 represent impedance matching resistors that may be employed in a double terminated transmission channel. That is to say, for example, that an equivalent resistive network is provided at the transmitter, whereby the termination at the transmitter and the termination provided by resistors 102 and 104 are impedance matched to the characteristic impedance of the transmission channel being used, e.g., 50 ohms.

Switches 118 and 120 are closed during a DC mode of operation, since closure of switches 118 and 120 places a short circuit across capacitors 106 and 108, respectively. Conversely, switches 118 and 120 are left open during an AC mode of operation. In such an instance, resistor/capacitor (RC) filter 110/106 and RC filter 112/108 operate as high-pass filters to prevent low-frequency content, injected at nodes $IN_P$ and $IN_N$, from affecting the conductivity state of transistors 114 and 116.

By injecting a programmable, common mode voltage at nodes 122 and 124, a dual mode of operation of input buffer 100 is accomplished. That is to say, for example, that switches 118 and 120 may be left open to allow RC filters 110/106 and 112/108 to block any low frequency components that may exist at nodes $IN_P$ and $IN_N$. At the same time, a programmable common mode voltage, $V_{CM}$, may be injected at nodes 122 and 124 via bias resistors 110 and 112 in order to bias transistors 114 and 116 into a proper conductivity state. In this way, input buffer 100 is AC coupled between nodes $IN_P$ and 122 and between nodes $IN_N$ and 124, while at the same time, maintaining a proper DC bias at the control inputs of transistors 114 and 116 via programmable common mode voltage, $V_{CM}$.

In certain communication systems, however, the communication protocol requires a physical layer that remains DC coupled, while simultaneously operating at a common mode voltage at or near ground potential. An example of such a protocol is illustrated by the Fully Buffered Dual In-Line Memory Module (FB-DIMM) specification, whereby the FB-DIMM operates as a memory device that maintains a very low duty cycle on its data lines.

As such, the FB-DIMM compliance specification requires DC coupling in order to prevent the "bleeding away" of data levels on those data lines. Turning back to FIG. 1, it can be seen that the closure of switches 118 and 120 provides the requisite DC coupling for FB-DIMM compliance. The common mode voltage, however, that exists at nodes 122 and 124 during the DC mode of operation is most likely insufficient to properly bias transistors 114 and 116 into a conductive state, since the common mode voltage necessary for FB-DIMM compliance is substantially equal to $V_{SS}$.

Improvements continue to be developed, therefore, to allow wide variations in the common mode input voltage without degrading the performance of a DC coupled input buffer. The AC mode of operation should also be enhanced, whereby proper sampling of the input data may be facilitated despite the existence of DC imbalances, prolonged periods of data inactivity, and large variations in common mode voltages at the input nodes of an input buffer.

SUMMARY

To overcome limitations in the prior art, and to overcome other limitations that will become apparent upon reading and understanding the present specification, various embodiments of the present invention disclose an apparatus and method of providing hybrid coupling of an input buffer. In particular, enhanced DC coupling accommodates large variations in the common mode input range, while simultaneously providing AC coupled operations to facilitate error-free sampling of the input signal, despite the presence of DC imbalances and long periods of data inactivity.

In accordance with one embodiment of the invention, an input buffer comprises an alternating current (AC) coupling circuit that is coupled to receive a first signal at a first node and is adapted to provide a second signal to a second node in response to the first signal. The second signal exhibits attenuated frequency content below a first frequency. The input buffer further comprises a frequency restoration circuit that is coupled to receive the first signal at the first node and is adapted to provide a third signal to the second node in response to the first signal. The third signal exhibits frequency content above the first frequency. The third signal is summed with the second signal at the second node to restore the attenuated content of the second signal.

In accordance with another embodiment of the invention, a differential input buffer comprises an alternating current (AC) coupling circuit that is coupled to receive a differential signal at first and second input nodes and is adapted to attenuate the differential signal below a corner frequency to form a high-pass filtered signal. The high-pass filtered signal is applied to first and second intermediate nodes. The differential input buffer further comprises a low frequency restoration circuit that is coupled to receive the differential signal at the first and second input nodes and is adapted to attenuate the differential signal above the corner frequency to form a low-pass filtered signal. The low-pass filtered signal being applied to the first and second intermediate nodes. The AC coupling circuit sets the corner frequency for both the AC coupling circuit and the low frequency restoration circuit.

In accordance with another embodiment of the invention, a method of providing direct current (DC) coupling of an input buffer comprises receiving an input signal, attenuating frequency content of the input signal below a corner frequency to provide an alternating current (AC) coupled signal to an intermediate node, attenuating frequency content of the input signal above the corner frequency to provide a DC coupled signal to the intermediate node, summing the AC and DC coupled signals together at the intermediate node, and driving a differential amplifier with the summed signal to provide an output from the input buffer.

BRIEF DESCRIPTION OF THE DRAWINGS

Various aspects and advantages of the invention will become apparent upon review of the following detailed description and upon reference to the drawings in which.

DETAILED DESCRIPTION

Generally, the various embodiments of the present invention are applied to combining an alternating current (AC) coupling technique with a low frequency restoration technique. The low frequency restoration circuit operates to: 1) extract low frequency information prior to being high-pass filtered by the AC coupling circuitry; 2) buffer the low frequency information through a low frequency restoration amplifier; 3) apply a programmable common mode voltage to the buffered, low frequency information; and 3) restore the buffered, common mode adjusted, low frequency information at the output of the AC coupling circuitry.

The low frequency restoration circuit is integrated with the AC coupling circuitry, such that the low-pass function of the low frequency restoration circuit is naturally matched to the high-pass function of the AC coupling circuit. As such, the low frequency restoration circuit does not require a high-bandwidth, nor does it require a well-controlled bandwidth for proper operation. In addition, the load resistance imposed by the low frequency restoration circuit may be several orders of magnitude larger than the impedance matching network employed by the input buffer, so as to avoid adverse loading of the impedance matching network by the low frequency restoration circuit.

Figure 1:
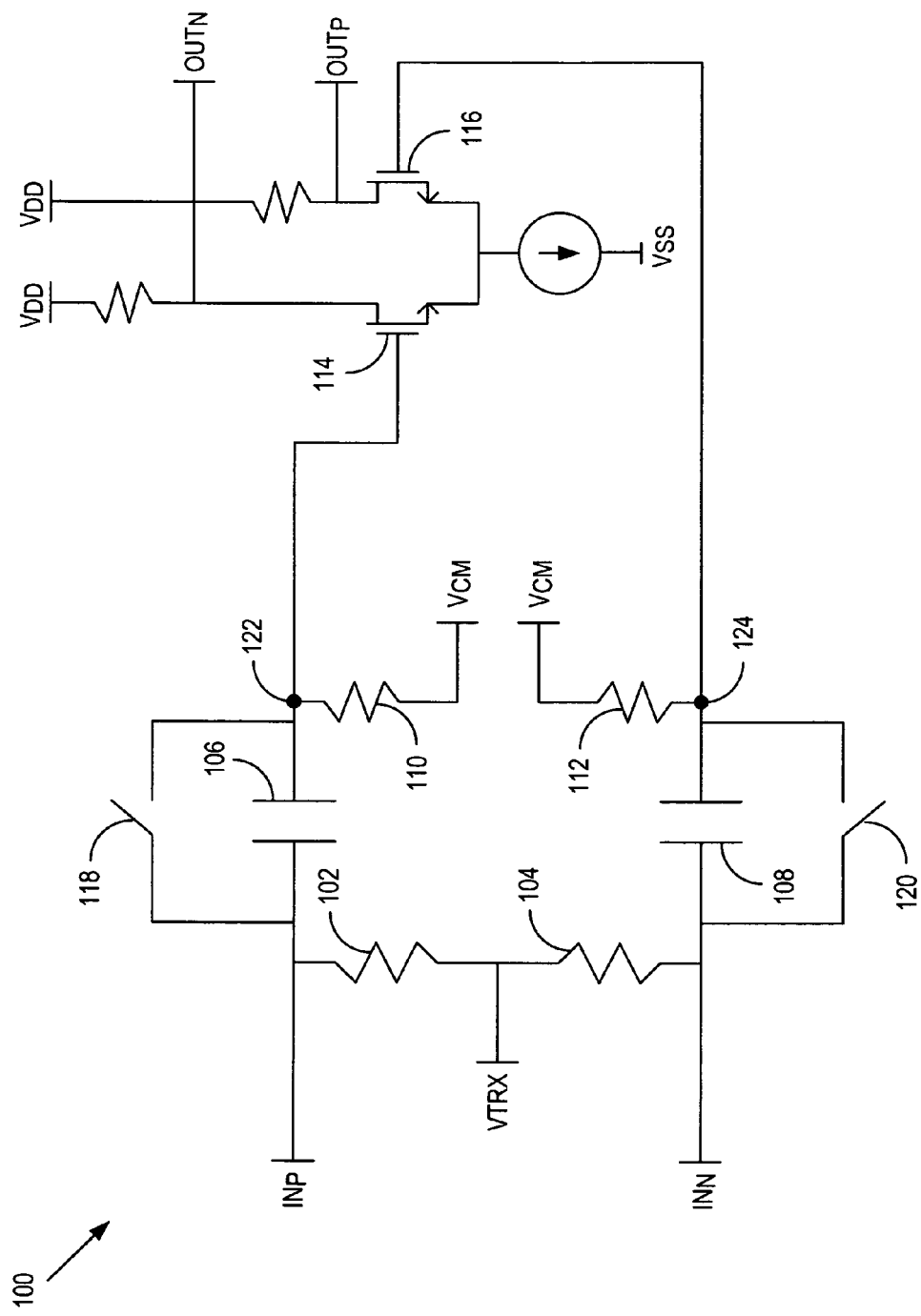
FIG. 1 illustrates a prior art input buffer.
Figure 2:
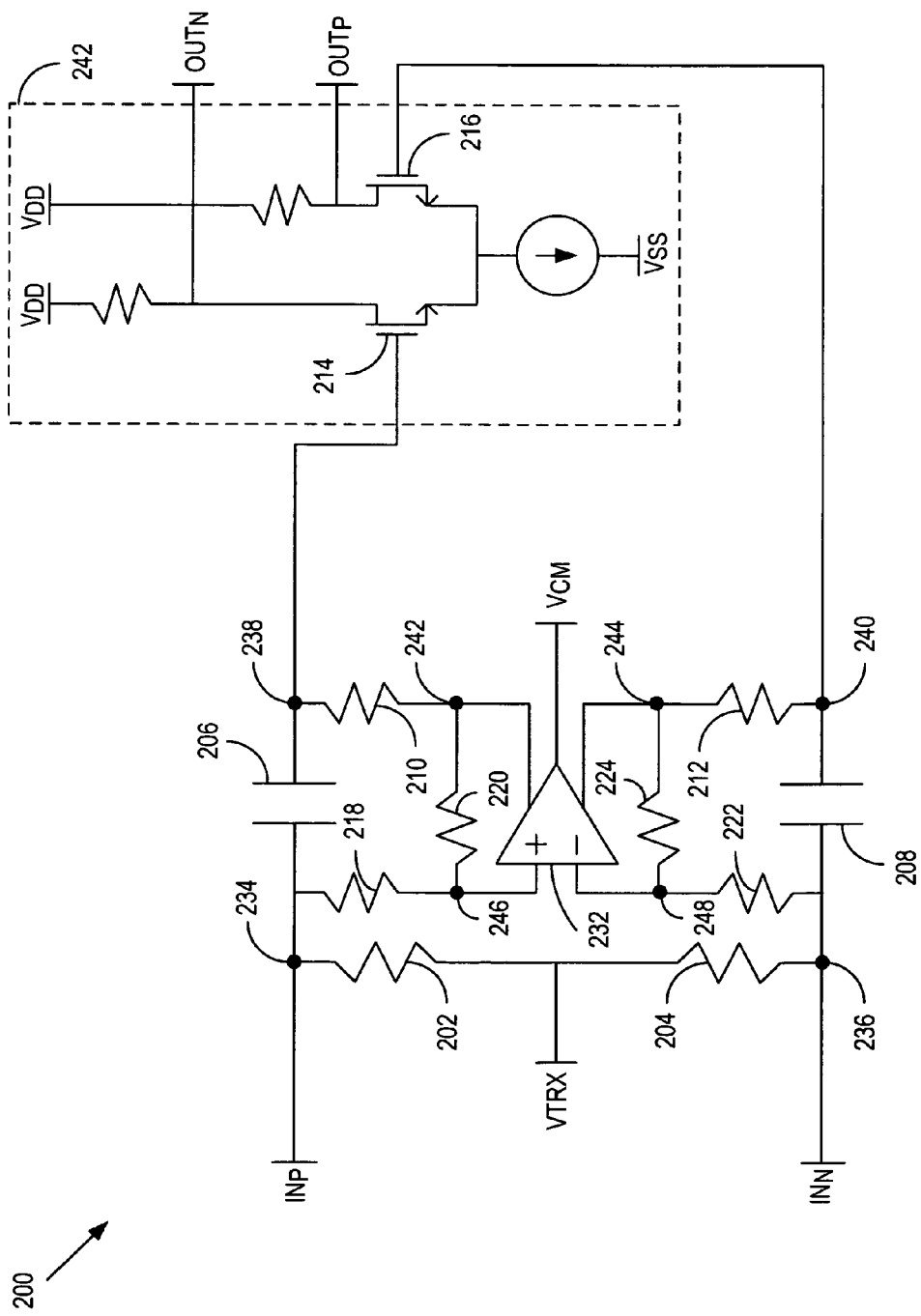
FIG. 2 illustrates an exemplary schematic of an alternating current (AC) coupled input buffer with low frequency restoration.

Turning to FIG. 2, an exemplary schematic diagram of input buffer 200 is illustrated. In operation, a differential signal is received by input buffer 200 at nodes $IN_P$ and $IN_N$, which is transmitted by a transmitter (not shown) through a transmission channel (not shown). An output signal is then provided at output nodes $OUT_N$ and $OUT_P$ in response to the differential input signal, such that a logic high input at node $IN_P$ results in a logic high output at node $OUT_P$ and a logic low output at the complementary logic output node, $OUT_N$. Conversely, a logic high input at node $IN_N$ results in a logic high output at node $OUT_N$ and a logic low output at the complementary logic output node, $OUT_P$. It should be noted that input buffer 200 may also be operated in a signal-ended fashion, whereby either of input nodes $IN_P$ and $IN_N$ may be hard-wired to a fixed potential, while the remaining input node receives the input signal and the corresponding output node responds as discussed above.

Resistors 202 and 204 represent impedance matching resistors that may be employed in a double terminated transmission channel. That is to say, for example, that an equivalent resistive network is provided at the transmitter, whereby the termination at the transmitter and the termination provided by resistors 202 and 204 are impedance matched to the characteristic impedance of the transmission channel being used, e.g., 50 ohms.

A high-pass, RC filter is formed by the resistor/capacitor pairs 210/206 and 212/208, which provides low-frequency attenuation of the input signal that is applied to nodes $IN_P$ and $IN_N$. The 3-dB corner frequency of the high pass filter may typically be set to, e.g., $f_C$=50 kHz, by setting the capacitive reactance, $Z_C$, of capacitors 206 and 208, given by equation (5), to be equal to the resistance magnitude of bias resistors 210 and 212, respectively.

$$Z_C = \frac{1}{2\pi f_c C}. \quad (5)$$

Hence, by setting the resistance magnitude of bias resistors 210 and 212 to a value of, e.g., 500,000 ohms, the capacitance magnitude, C, of capacitors 206 and 208 is computed to be approximately 6 pico-farads (pf) provided that the 3-dB corner frequency, $f_C$, of 50 kHz is desired.

Buffer 232, bias resistors 210-212, and gain setting resistors 218-224 comprise the low frequency restoration circuit. Buffer 232 may receive a differential input, whereby the input signal at node 234 is provided to the non-inverting input of buffer 232 via resistor 218 at node 246 and the input signal at node 236 is provided to the inverting input of buffer 232 via resistor 222 at node 248. The differential output of the low frequency restoration circuit is provided at nodes 242 and 244.

It can be seen, therefore, that the low frequency restoration circuit accepts an input at nodes 234 and 236 and subsequently provides a buffered output to nodes 238 and 240 via bias resistors 210 and 212, respectively. It can also be seen, that as the signal propagates from nodes 242/244 to nodes 238/240, the signal is low-pass filtered by operation of RC networks 210/206 and 212/208. As such, nodes 238 and 240 may be considered as summing nodes, whereby the output signals from high-pass filters 210/206 and 212/208 are summed with the low frequency restoration circuit output at nodes 238 and 240 to restore the low frequency content previously attenuated by high-pass filters 210/206 and 212/208.

Both the low-pass corner frequency, as provided by the low frequency restoration circuit, and the high-pass corner frequency, as discussed above in relation to the AC coupling circuitry, depend upon the transfer function set by RC networks 210/206 and 212/208. As such, the low-pass corner frequency and the high-pass corner frequency are inherently matched to each other. That is to say, for example, that any alteration in the resistance and/or capacitance magnitudes of RC networks 210/206 and 212/208 results in a corresponding and matching change in the low-pass and high-pass corner frequencies of the low frequency restoration circuit and the AC coupling circuit, respectively. It should be noted, that the operational bandwidth associated with buffer 232 need only be somewhat higher, e.g., one or two octaves higher, than the low-pass and high-pass cutoff frequency. As such, the operational bandwidth of buffer 232 may be much lower than the input frequency at nodes 234/236.

In addition, since the resistance magnitude of biasing resistors 210 and 212 is much larger than the resistance magnitude of impedance matching resistors 202 and 204, standard resistors, i.e., resistors 218-224, may be used to set the gain of buffer 232. In one embodiment, the resistance magnitude of resistors 218-224 may be set to 5000 ohms, in order to configure buffer 232 as a unity gain buffer. In such an instance, the resistance magnitude of gain setting resistors 218-224 is large enough so as to avoid loading down the resistance magnitude of impedance matching resistors 202-204, which in one embodiment is set to 50 ohms. In addition, the resistance magnitude of bias resistors 210 and 212 is large enough so as to avoid loading down the gain setting resistors 218-224.

By combining the low frequency restoration circuit with the AC coupling circuit as discussed above, a standard, high-frequency differential amplifier stage may be utilized, such as that illustrated by block 242. That is to say, for example, that wide variations in the $V_{CM}$ existing at nodes $IN_P$ and $IN_N$ may be tolerated, since the $V_{CM}$ is cancelled by the common mode rejection operation of buffer 232. It should be noted that block 242 need not necessarily be implemented as a high-speed buffer. Instead, block 242 may be implemented via any number of signal processing circuits, such as amplifiers, equalizers, samplers, etc.

The correct magnitude of $V_{CM}$ may then be reapplied at the $V_{CM}$ adjustment node of buffer 232, so as to properly bias N-type transistors 214 and 216 into their conductive states. Thus, conventional high-speed operation of input buffer 200 is maintained through the use of block 242, while the low frequency restoration circuit simultaneously accommodates a wide $V_{CM}$ range at nodes $IN_P$ and $IN_N$.

Figure 3:
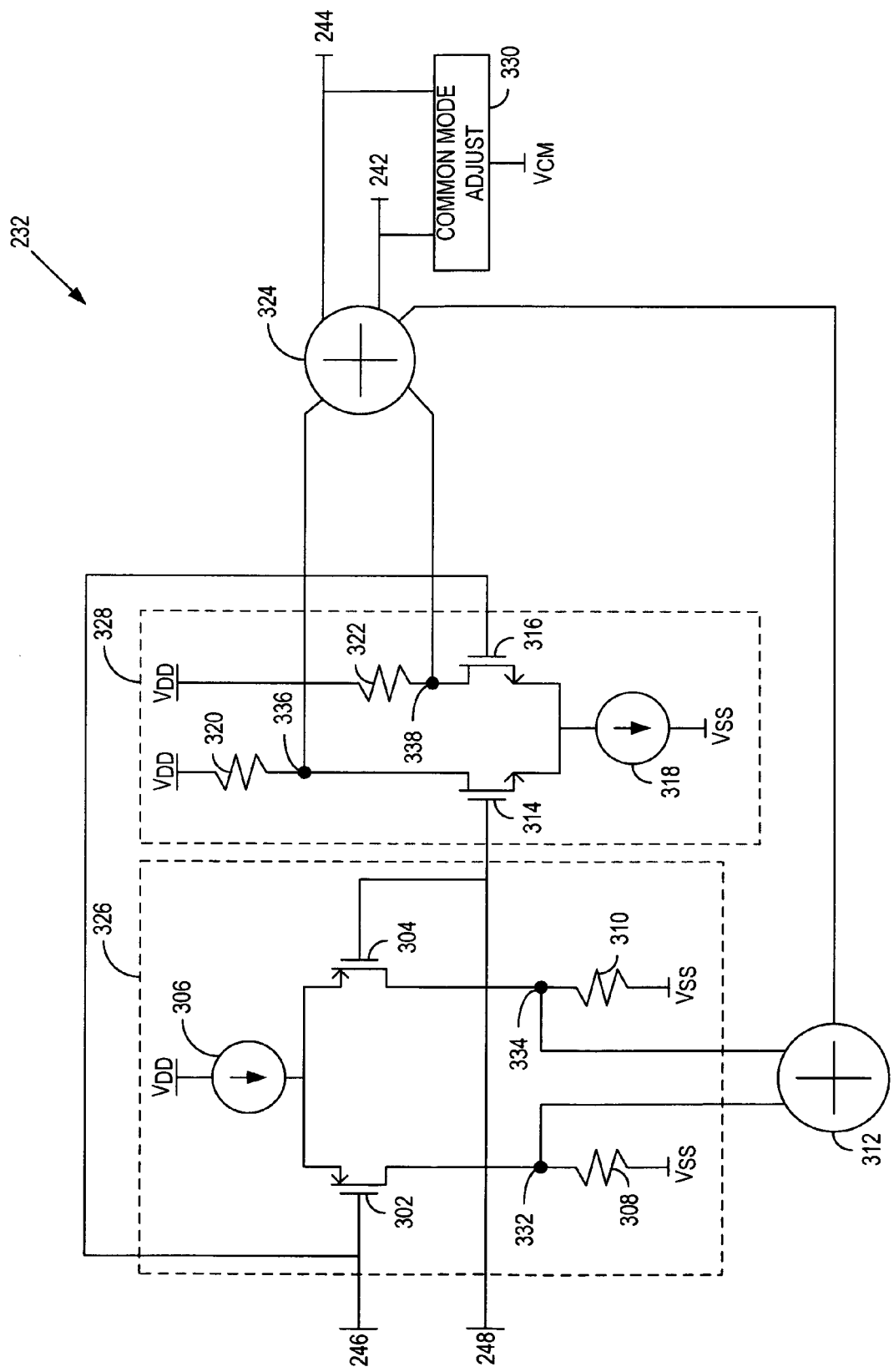
FIG. 3 illustrates an exemplary schematic of the low frequency restoration amplifier of FIG. 2.

Turning to FIG. 3, an exemplary schematic of buffer 232 is illustrated, whereby P-type field effect transistor (FET) pair 302/304 and N-type FET pair 314/316 receive the input signal at nodes 246 and 248. The dual N-type and P-type differential pairs provide near rail-to-rail logic valued outputs at nodes 242 and 244 in response to logic inputs presented at nodes 246 and 248.

Differential amplifier 326 is illustrative of a $V_{SS}$-referenced CML amplifier that provides output logic levels at nodes 332 and 334. In particular, the output logic low level, $V_{OL}$, is substantially equal to $V_{SS}$ and the output logic high level, $V_{OH}$, is substantially equal to $V_{SS}$ plus the product of the head current, e.g., the current conducted by current source 306, and the load resistance, e.g., the resistance magnitude of resistor 308 or 310, as described in equation (3). Summer 312 collects the output logic levels from differential amplifier 326 and provides them to summer 324 to be summed with the output logic levels of differential amplifier 328.

Differential amplifier 328, on the other hand, is illustrative of a $V_{DD}$-referenced CML amplifier that provides output logic levels at nodes 336 and 338. In particular, the output logic high level, $V_{OH}$, is substantially equal to $V_{DD}$ and the output logic low level, $V_{OL}$, is substantially equal to $V_{DD}$ minus the product of the tail current, e.g., current source 318, and the load resistance, e.g., the resistance magnitude of resistor 320 or 322, as described by equation (1). Thus, near rail-to-rail logic output levels are provided at nodes 242 and 244 through operation of the summed outputs of differential amplifiers 326 and 328, whereby the output logic high level, $V_{OH}$, is substantially equal to $V_{DD}$ and the output logic low level, $V_{OL}$, is substantially equal to $V_{SS}$.

As discussed above, common mode voltage existing at nodes 246 and 248 of buffer 232 is substantially cancelled by the common mode rejection properties of differential amplifiers 326 and 328. In order to properly bias differential amplifier 242 of FIG. 2, therefore, common mode adjust block 330 accepts a programmable common mode voltage, $V_{CM}$, and applies it to output nodes 242 and 244. As such, the control terminals of N-type FETs may be biased to insure a proper conductivity state across the entire dynamic range of logic inputs.

Figure 4:
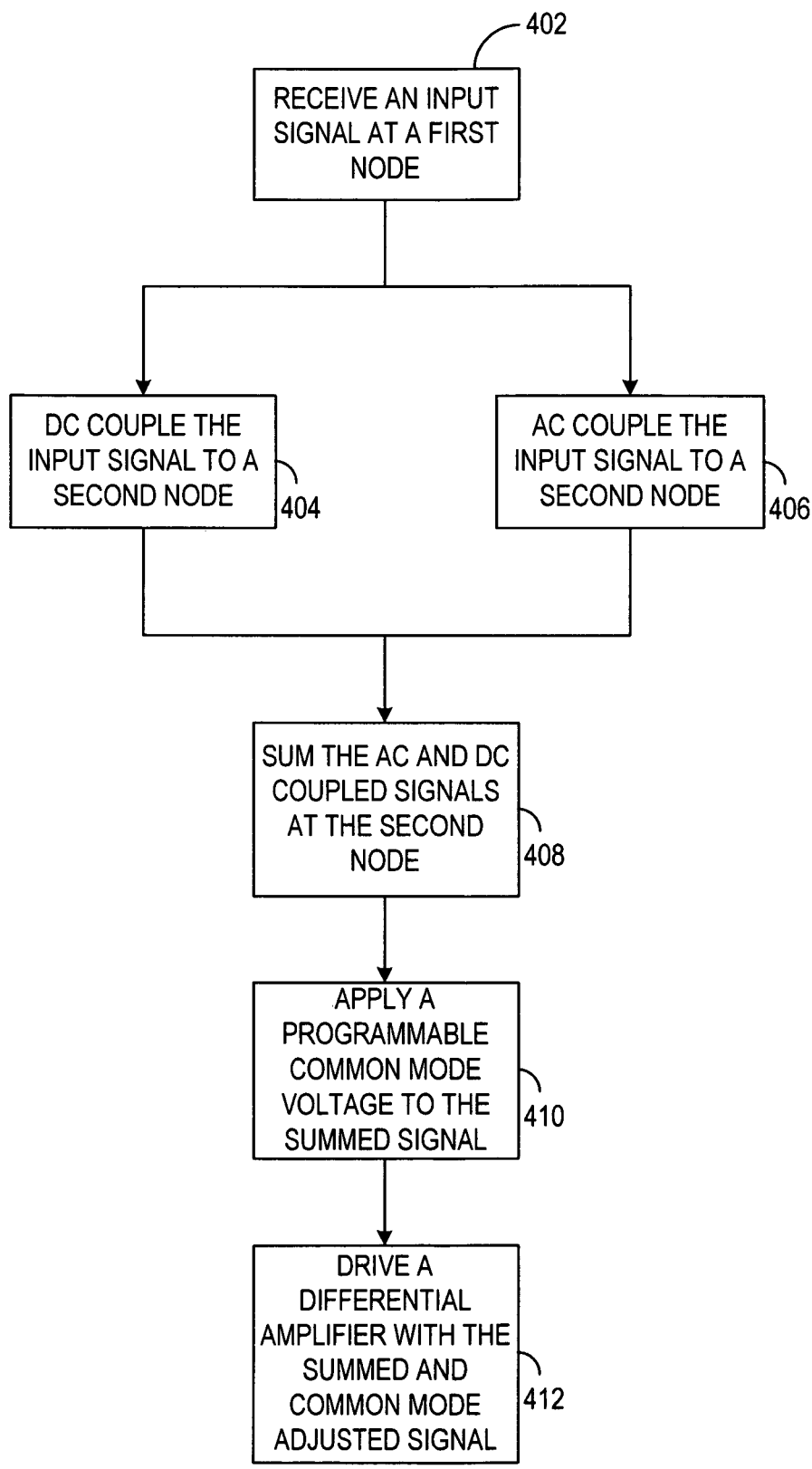
FIG. 4 illustrates a flow chart of an exemplary method of providing direct current (DC) coupling.

Turning to FIG. 4, a flow diagram of a method of DC coupling an input buffer is exemplified. In step 402, an input signal is received by the input buffer at a first node, e.g., input nodes $IN_P$ and $IN_N$ of FIG. 2. The input signal is then AC coupled, as in step 406, via high-pass, RC networks 210/206 and 212/208 and applied to intermediate nodes 238 and 240. The input signal is also DC coupled, as in step 404, via low frequency restoration circuitry, e.g., buffer 232, gain resistors 218-224, and bias resistors 210 and 212.

The AC and DC coupled signals are then summed, as in step 408, at the intermediate nodes 238 and 240. A programmable, common mode voltage is then applied to the summed signal as in step 410. The summed and common mode adjusted signal is then used to drive a high-speed, differential transistor pair, as in step 412, to provide the output from the input buffer. Thus, low frequency content that is filtered off by the AC coupling circuitry is restored by the low frequency restoration circuitry. Furthermore, the restored low frequency content is not plagued by any DC imbalances that may exist within the input signal due to the common mode rejection attributes of buffer 232. Still further, buffer 232 allows a programmable, common mode voltage to be applied to the control terminals of transistors 214 and 216 in order to maintain a properly biased conductivity state.

Other aspects and embodiments of the present invention will be apparent to those skilled in the art from consideration of the specification and practice of the invention disclosed herein. For example, while FETs were discussed in relation to the embodiments presented herein, other transistor topologies, such bipolar junction transistors (BJTs) may be used. Further, resistive elements and capacitive elements, as discussed herein, may also be implemented using active components, such as FETs, in order to simplify the production process. It is intended that the specification and illustrated embodiments be considered as examples only, with a true scope and spirit of the invention being indicated by the following claims.

What is claimed is:

1. An input buffer, comprising:
   an alternating current (AC) coupling circuit coupled to receive a first signal at a first node and adapted to provide a second signal to a second node in response to the first signal, the second signal exhibiting attenuated frequency content below a first frequency, the alternating current coupling unit comprising:
      a first capacitor having a first conductor coupled to the first node and a second conductor coupled to the second node;
      and a first resistor having a first conductor coupled to the first node; and
   a frequency restoration circuit coupled to receive the first signal at the first node and adapted to provide a third signal to the second node in response to the first signal, the third signal exhibiting frequency content above the first frequency, wherein the third signal is summed with the second signal at the second node to restore the attenuated content of the second signal, the frequency restoration circuit comprising:
      a buffer having a first input coupled to receive the first signal and a first output coupled to provide the third signal;
      a second resistor having a first conductor coupled to the first node and a second conductor coupled to the first input of the buffer;
      a third resistor having a first conductor coupled to the first input of the buffer and a second conductor coupled to the first output of the buffer; and
      a fourth resistor having a first conductor coupled to the first output of the buffer and a second conductor coupled to the second node.

2. The input buffer of claim 1, wherein a resistance magnitude of the second and third resistors is equal.

3. The input buffer of claim 2, wherein a resistance magnitude of the fourth resistor is larger than the resistance magnitude of the second and third resistors.

4. The input buffer of claim 1, wherein the buffer comprises:
   a first transistor of a first conduction type having a control terminal coupled to receive the first signal and a first conduction terminal coupled to conduct a first current in response to the first signal; and
   a first load coupled to receive the first current and adapted to provide a first output signal in response to the first current.

5. The input buffer of claim 4, wherein the buffer further comprises:
   a second transistor of a second conduction type having a control terminal coupled to receive the first signal and a first conduction terminal coupled to conduct a second current in response to the first signal; and
   a second load coupled to receive the second current and adapted to provide a second output signal in response to the second current.

6. The input buffer of claim 5, wherein the buffer further comprises a summer coupled to the first and second loads and adapted to sum the first and second output signals to provide the third signal at the second node.

7. The input buffer of claim 6, wherein the buffer further comprises a common mode adjust block coupled to the output of the summer and adapted to adjust a common mode voltage of the third signal.

8. The input buffer of claim 7, further comprising an amplifier having an input coupled to receive the sum of the second and third signals from the second node and adapted to provide an output signal in response to the summed second and third signals.

9. A differential input buffer, comprising:
   an alternating current (AC) coupling circuit coupled to receive a differential signal at first and second input nodes and adapted to attenuate the differential signal below a corner frequency to form a high-pass filtered signal, the high-pass filtered signal being applied to first and second intermediate nodes; and
   a low frequency restoration circuit coupled to receive the differential signal at the first and second input nodes and adapted to attenuate the differential signal above the corner frequency to form a low-pass filtered signal, the low-pass filtered signal being applied to the first and second intermediate nodes, wherein the AC coupling circuit sets the corner frequency for both the AC coupling circuit and the low frequency restoration circuit.

10. The differential input buffer of claim 9, wherein the AC coupling circuit comprises:
    a first capacitor having a first conductor coupled to the first input node and a second conductor coupled to the first intermediate node;
    a first resistor having a first conductor coupled to the first intermediate node;
    a second capacitor having a first conductor coupled to the second input node and a second conductor coupled to the second intermediate node; and
    a second resistor having a first conductor coupled to the second intermediate node.

11. The differential input buffer of claim 10, wherein the low frequency restoration circuit comprises:
    a first input resistor having a first conductor coupled to the first input node;
    a second input resistor having a first conductor coupled to the second input node; and
    a buffer having a first input coupled to a second conductor of the first input resistor and a second input coupled to a second conductor of the second input resistor.

12. The differential input buffer of claim 11, wherein the low frequency restoration circuit further comprises:
    a first feedback resistor having a first conductor coupled to the first input of the buffer and a second conductor coupled to a first output of the buffer;
    a second feedback resistor having a first conductor coupled to the second input of the buffer and a second conductor coupled to a second output of the buffer;
    a first bias resistor having a first conductor coupled to the first output of the buffer and a second conductor coupled to the first intermediate node; and
    a second bias resistor having a first conductor coupled to the second output of the buffer and a second conductor coupled to the second intermediate node.

13. The differential input buffer of claim 12, wherein the buffer comprises:
    a first transistor pair of a first conductivity type having a first control terminal coupled to a second conductor of the first input resistor and a second control terminal coupled to a second conductor of the second input resistor; and
    a second transistor pair of a second conductivity type having a first control terminal coupled to the second conductor of the second input resistor and a second control terminal coupled to the second control terminal of the first input resistor.

14. The differential input buffer of claim 13, wherein the buffer further comprises:
    a first summer coupled to first conductors of the first transistor pair and adapted to sum outputs of the first transistor pair; and
    a second summer coupled to first conductors of the second transistor pair and coupled to the first summer, the second summer being adapted to sum outputs of the second transistor pair with the summed outputs of the first transistor pair.

15. The differential input buffer of claim 14, wherein the buffer further comprises a common mode adjust block coupled to the second summer and adapted to apply a programmable common mode voltage to a differential output of the second summer.

16. The differential input buffer of claim 15, further comprising a third transistor pair having control terminals coupled to the first and second intermediate nodes and adapted to provide first and second output signals in response to the high-pass and low-pass filtered signals.

17. A method of providing direct current (DC) coupling of an input buffer, comprising:
    receiving an input signal;
    attenuating frequency content of the input signal below a corner frequency to provide an alternating current (AC) coupled signal to an intermediate node;
    attenuating frequency content of the input signal above the corner frequency to provide a DC coupled signal to the intermediate node;
    summing the AC and DC coupled signals together at the intermediate node; and
    driving a differential amplifier with the summed signal to provide an output from the input buffer; and
    applying a programmable common mode voltage to the summed signal at the intermediate node to properly bias the differential amplifier.

* * * * *